United States Patent
Schuttert et al.

(10) Patent No.: US 7,685,488 B2
(45) Date of Patent: Mar. 23, 2010

(54) CIRCUIT INTERCONNECT TESTING ARRANGEMENT AND APPROACH THEREFOR

(75) Inventors: Rodger Frank Schuttert, Eindhoven (NL); Tom Waayers, Sint Michielsgestel (NL)

(73) Assignee: NXP B.V., Eindhoven (NL)

( * ) Notice: Subject to any disclaimer, the term of this patent is extended or adjusted under 35 U.S.C. 154(b) by 3 days.

(21) Appl. No.: 11/572,808

(22) PCT Filed: Jul. 28, 2005

(86) PCT No.: PCT/IB2005/052551

§ 371 (c)(1),
(2), (4) Date: Nov. 20, 2008

(87) PCT Pub. No.: WO2007/026191

PCT Pub. Date: Mar. 8, 2007

(65) Prior Publication Data

US 2009/0077438 A1  Mar. 19, 2009

Related U.S. Application Data

(60) Provisional application No. 60/591,834, filed on Jul. 28, 2004.

(51) Int. Cl.
G01R 31/28  (2006.01)
(52) U.S. Cl. ........................ 714/727; 714/726
(58) Field of Classification Search ................. 714/726, 714/727
See application file for complete search history.

(56) References Cited

U.S. PATENT DOCUMENTS

| | | | |
|---|---|---|---|
| 5,056,094 A | | 10/1991 | Whetsel |
| 5,815,512 A | * | 9/1998 | Osawa et al. ................ 714/726 |
| 6,000,051 A | | 12/1999 | Nadeau-Dostie et al. |
| 7,305,601 B2 | * | 12/2007 | Vu ............................ 714/726 |
| 2002/0083389 A1 | | 6/2002 | Grisenthwaite |
| 2002/0116674 A1 | | 8/2002 | Schmid |
| 2003/0034795 A1 | * | 2/2003 | Otto et al. ..................... 326/16 |
| 2003/0149924 A1 | | 8/2003 | Bedal et al. |

FOREIGN PATENT DOCUMENTS

| | | |
|---|---|---|
| WO | 0054067 A1 | 9/2000 |
| WO | 2004068156 A | 8/2004 |

OTHER PUBLICATIONS

Bennetts, DR R.G.; IEEE 1149.1 Test Access Port and Boundary—Scan Standard; Feb. 1, 2001.

* cited by examiner

Primary Examiner—Kevin L Ellis
Assistant Examiner—Steve Nguyen

(57) ABSTRACT

Logic level crossings in an integrated circuit are detected. According to an example embodiment, a reset signal is provided to a flip-flop (314) as a function of a logic level of an integrated circuit. A logic level crossing condition of the integrated circuit is indicated as a function of the reset condition of the flip flop. In one implementation, the flip-flop is reset when the logic level is different than an expected logic level. In another implementation, a pair of flip-flops (414, 418) are implemented such that only one flip-flop is reset at a particular logic level; if the logic level crosses, both flip-flops are reset. The aforesaid condition of both flip-flops being reset is used to indicate the logic level crossing.

11 Claims, 4 Drawing Sheets

CIRCUIT INTERCONNECT TESTING ARRANGEMENT AND APPROACH THEREFOR

CROSS REFERENCE TO RELATED APPLICATION

This application claims the benefit of U.S. provisional application Ser. No. 60/591834 filed 2004, Jul. 28, which is incorporated herein whole by reference.

The present invention relates generally to circuit testing anymore particularly, to circuit testing arrangements and approaches involving the testing of interconnections within an integrated circuit.

Electronic circuits such as integrated circuits have increased in complexity and density at a rapid pace, and implementations for these electronic circuits have required increased reliability at an affordable price. In this regard, testing and analysis of electronic circuits for a variety of purposes has become increasingly important, while also becoming increasingly complex due to the nature and orientation of electronic circuits. For instance, many integrated circuit components are scaled to a relatively small size that makes directly (e.g., physically) accessing the components challenging. In addition, spacing between these components has also been increasingly smaller, presenting further challenges to accessing the components.

One approach used for testing and analyzing circuits involves boundary scan testing, wherein boundary cells on an integrated circuit are accessed for testing other portions of the integrated circuit. Boundary scan analysis facilitates the control and observation of boundary pins of a Joint Test Access Group (JTAG) compatible device via software control. Boundary scan analysis is typically implemented using the Institute of Electrical and Electronic Engineers (IEEE) standard 1149.1, known as the IEEE Standard Test Access Port and Boundary Scan Architecture. Circuits arranged for boundary-scan analysis typically employ built-in architecture, with pins located at the "boundary" of the circuit and accessible for passing test signals to and from the circuit. Inputs provided via the pins are coupled to various portions of the circuit, depending on the type of input. Outputs from the circuit are passed to external test circuitry via the pins.

Boundary-scan cells are typically implemented as a multipurpose element that is accessed for input and/or output purposes. When test circuitry presents inputs to pins at certain boundary-scan cells, the cells respond by passing the inputs (or related signals) to other portions of the circuit (e.g., essentially forcing test data). Response outputs from the circuit (or related signals) are passed from the same or other boundary-scan cells to the test circuitry. These inputs and outputs can be serially shifted in and out using the boundary scan cells without necessarily accessing (directly or otherwise) circuit elements within the circuit that me be different to access. In addition, relatively simple test inputs (e.g., vectors) can be used to carry out testing via the boundary scan cells, alleviating the need for initializing sequential logic (as may be required without boundary scan cells).

Many integrated circuits are susceptible to defects relating to interconnects between circuit elements. These interconnects often exhibit opens (discontinuities) or shorts (short-circuits between interconnects). For many high speed interconnections, a signal waveform can not be viewed as a simple '0' or '1' as a result of these and other defects; the quality of interconnects via which the waveform is passed affects the signal shape. Properties such as cross-talk from other signals, impedance matching and propagation delays determine the quality of the interconnection. In the case of a poor quality interconnection, the signal waveform can degrade. Boundary scan analysis is useful for detecting open and short types of defects that typify such a poor quality interconnection. However, boundary scan analysis has been limited in application to the detection of opens and shorts, and generally inapplicable to the detection of other conditions and characteristics relating to opens, shorts and other defects.

These and other limitations present challenges to the implementation of integrated devices with a variety of communications approaches.

Various aspects of the present invention involve approaches for a variety of circuits, such as those boundary scan cell type structures and others. The present invention is exemplified in a number of implementations and applications, some of which are summarized below.

According to an example embodiment of the present invention, a characteristic of an integrated circuit is detected as a function of a flip-flop reset condition using a boundary scan approach. An expected value and an actual value for a logic level represented by a particular circuit are used to control the flip-flop reset. The reset condition is monitored or otherwise used to detect a relationship between the expected and actual values (i.e., to detect that the values do or do not match).

In a more particular example embodiment of the present invention, a boundary scan cell include circuitry for implementing the above-discussed approach.

In another example embodiment of the present invention, a boundary scan cell and approach is used for detecting logic level crossings in an integrated circuit (IC). The boundary scan cell includes a flip-flop having an asynchronous reset coupled to the output of a logic circuit. The logic circuit is configured to provide a reset signal to the flip-flop when an expected logic value and an actual logic value do not match. The flip-flop is preloaded with a "1" value, and upon reset, changes to a "0" value that is used to detect a logic level crossing.

In another example embodiment of the present invention, the above-discussed boundary scan cell and approach involves using two flip-flops, each flip flop having an asynchronous reset. Each respective flip-flop is coupled to logic circuits that provide each flip flop with a reset signal as a function of an expected and actual logic value such that one of the flip-flops is reset and another one of the flip-flops is not reset for each expected logic level. When a logic level crossing occurs, the logic circuits provide reset signals to both flip-flops, with the condition of both flip-flops being reset indicative of logic level crossing. The values of the flip-flops can then be compared to detect the logic level crossing. In some applications, a comparison circuit is implemented to compare the values of the flip-flops and to provide a signal indicative of the logic level crossing.

The above summary of the present invention is not intended to describe each embodiment or every implementation of the present invention. The above summary of the present invention is not intended to describe each illustrated embodiment or every implementation of the present invention. The figures and detailed description that follow more particularly exemplify these embodiments.

The invention may be more completely understood in consideration of the following detailed description of various embodiments of the invention in connection with the accompanying drawings, in which.

Figure 1:
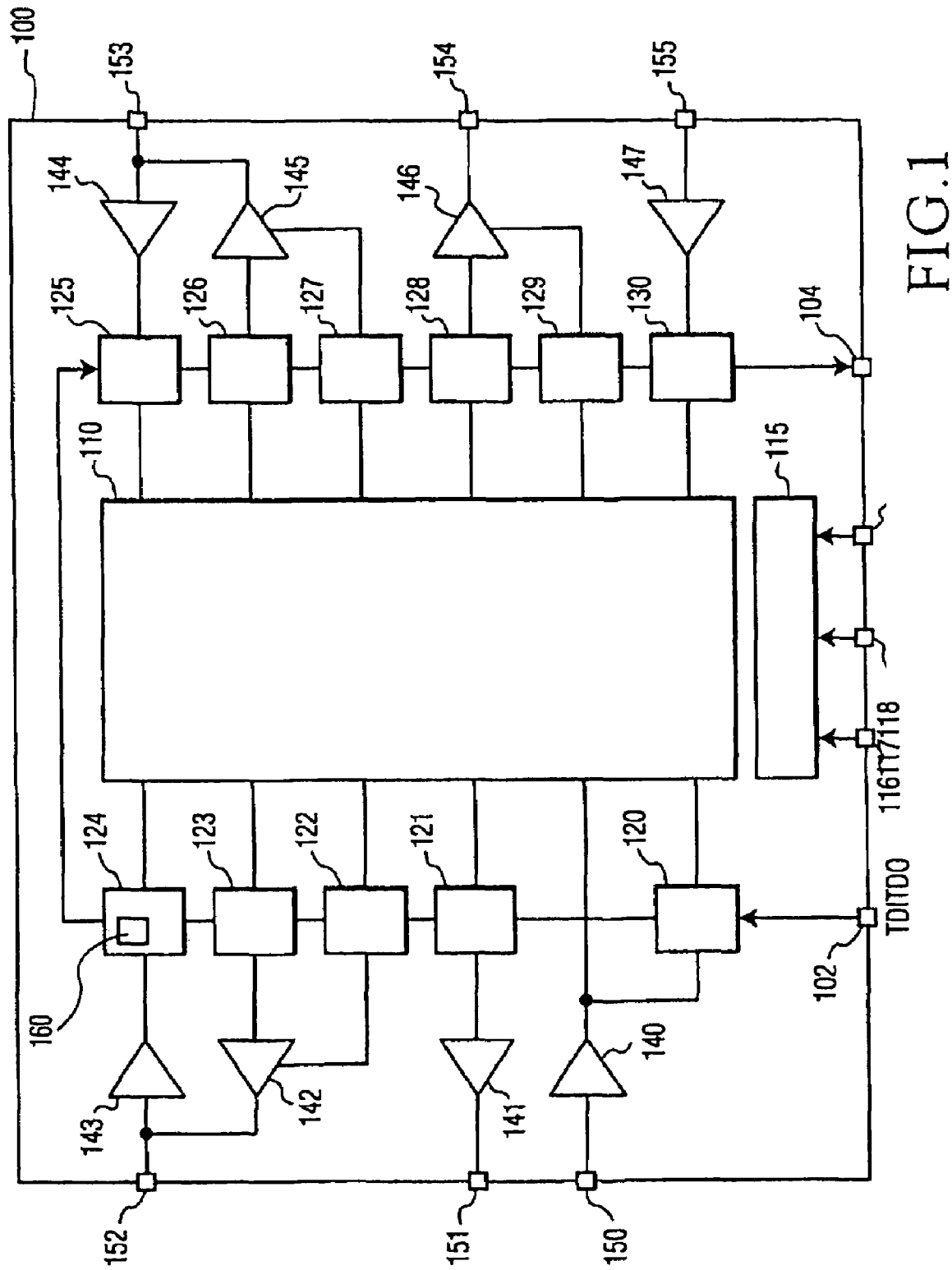
FIG. 1 shows a boundary scan arrangement and approach, according to an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention as defined by the appended claims.

The present invention is believed to be applicable to a variety of circuits and approaches involving electronic communications, and in particular to those involving communications between lanes. While the present invention is not necessarily limited to such applications, an appreciation of various aspects of the invention is best gained through a discussion of examples in such an environment.

According to an example embodiment of the present invention, a boundary scan cell approach facilitates the detection of logic level crossings in an integrated circuit. The boundary scan cell approach involves using a boundary scan cell to functionally implement the detection of a logic level crossing, generally resulting in the assertion of a particular logic level associated with a particular circuit condition.

Logic level crossings are generated in one or more of a variety of manners, with associated effects on coupled circuits. For example, in some implementations, logic level crossings cause a particular logic level (i.e., a "0" or "1") to be asserted onto a particular node or circuit element. Short or open can cause this type of assertion. This crossing may typically cause a particular logic level to switch from a "1" to a "0" or from a "0" to a "1." In some applications, the logic level crossings do not necessarily cause a switch in logic level, such as where a "1" is asserted onto a circuit element already at a logic level "1."

In some applications, the logic level crossings generally affect a voltage level (or other associated level) used to assert a particular logic level without necessarily causing a change in logic level at a particular circuit element. For instance, where a logic level "1" is asserted at a particular voltage level at a circuit element, a level crossing may generally change the voltage level without necessarily switching the logic level to a "0." Effectively, the logic level crossing has a parasitic effect on the voltage level of the circuit element, which may or may not cause a significant change in voltage level to swing the logic level between "1" and "0" values. In this regard, the logic level crossing effect detected using this approach (and others discussed herein) does not necessarily result in a swing in logic level.

In another example embodiment, boundary scan cell features that facilitate the detection of logic level crossings are implemented with other (i.e., conventional) boundary scan approaches by adding logic to a conventional boundary scan cell. In this embodiment, logic level crossings are detected as a function of an expected level and actual level of signals available to the boundary scan cell. In some applications, a comparison between the expected and actual levels is carried out for detecting the crossing, such as by electrically (logically or otherwise) comparing the two signals.

One or more of the above discussed approaches may be implemented in connection with the arrangements and approaches shown in FIGS. 1 and 2 and discussed below.

FIG. 1 shows a boundary scan arrangement and approach implemented on a chip 100, according to another example embodiment of the present invention. A plurality of boundary scan cells 120-130 are implemented on the chip 100 for testing core logic circuitry 110 using JTAG type analysis. The boundary scan cells are coupled to ports 150-155 and to various circuits 140-147 for implementing input and output signals as well as coupling to other boundary scan cells. A test access port (TAP) controller 115 controls the operation of the boundary scan cells, with portions 116, 117 and 118 implemented for accessing the TAP controller. Test data in (TDI) port 102 and test data out (TDO) ports 102 and 104 are respectively implemented for the input and output of test data, such as that indicating logic level crossings as discussed herein.

A level-crossing detector circuit 160 is implemented for detecting logic level crossings with boundary scan cell 124. In various implementations, such a level-crossing detector circuit is implemented with different or other ones of the boundary scan cells, for testing the core logic 110 or signals received from other circuits coupled via ports 150-155.

Figure 2:
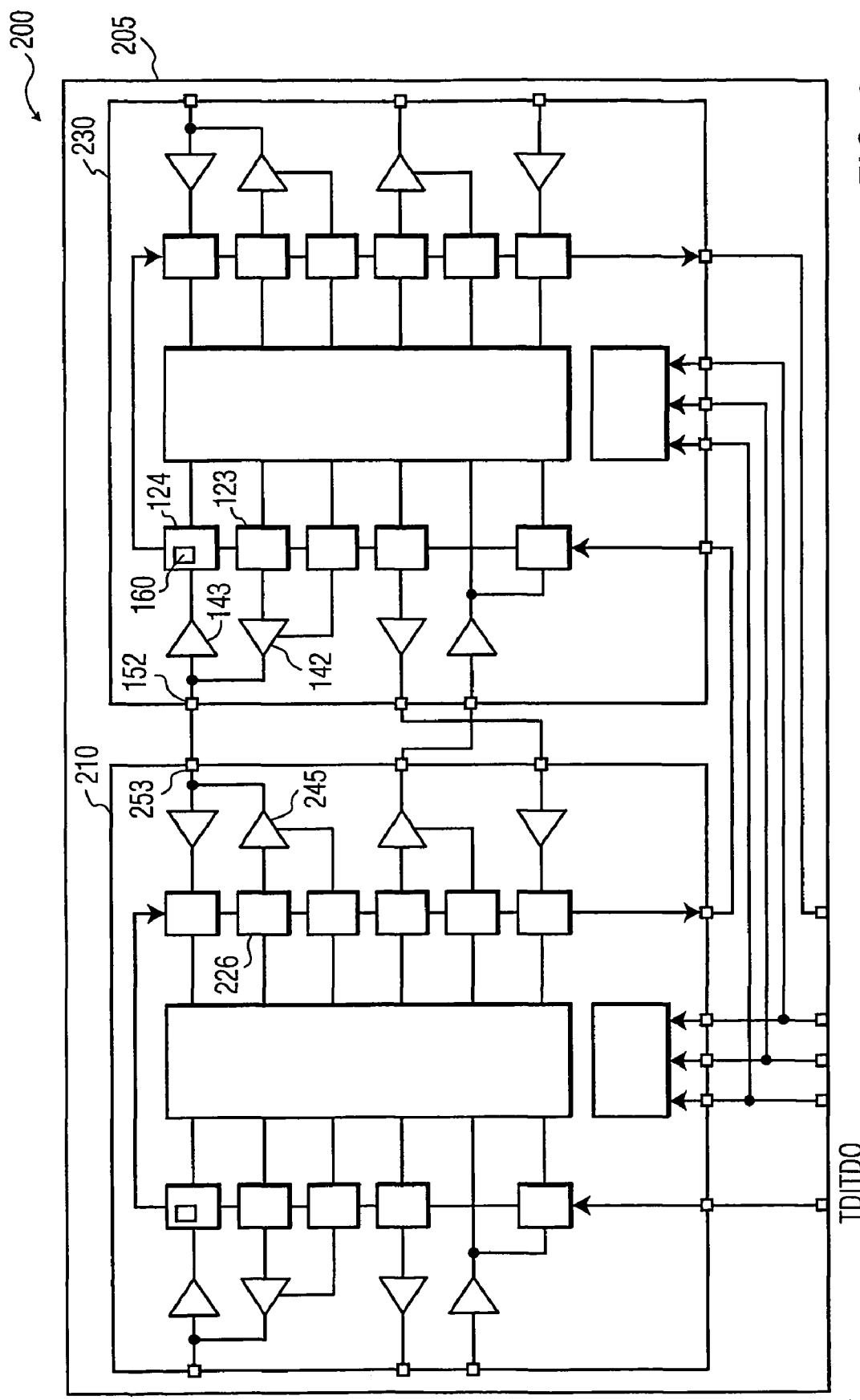
FIG. 2 shows a boundary scan arrangement and approach involving two boundary scan-implemented integrated circuits on a circuit board, according to another example embodiment of the present invention.

FIG. 2 shows a boundary scan arrangement and approach 200 involving two boundary scan-implemented integrated circuits on chips 210 and 230 coupled to a common circuit board 205, according to another example embodiment of the present invention. Each of the chips 210 and 230 as well as the corresponding circuitry on each is implemented in a manner similar to that described above in connection with the chip 100 shown in FIG. 1. Here, chip 230 is shown with a level-crossing detector circuit 160 implemented with a boundary scan cell 124, with chip 210 implemented without such a level crossing detector.

In some implementations, chip 210 includes a level-crossing detector with one or more of its boundary scan cells. For brevity, certain individual circuit components in chips 210 and 230 are not labeled or further discussed.

In the implementation shown in FIG. 2, the level-crossing detector 160 in boundary scan cell 124 can be applied for detecting a level crossing on chip 230 or chip 210. For example, a level crossing output from core logic on chip 230 via boundary scan cell 123 can fed to the level-crossing detector 160 in boundary scan cell 124 via circuits 142 and 143. Similarly, a level crossing output from core logic on chip 210 via boundary scan cell 226 can be fed to the level-crossing detector 160 in boundary scan cell 124 via circuit 245, ports 253 and 152, and circuit 143.

Figure 3:
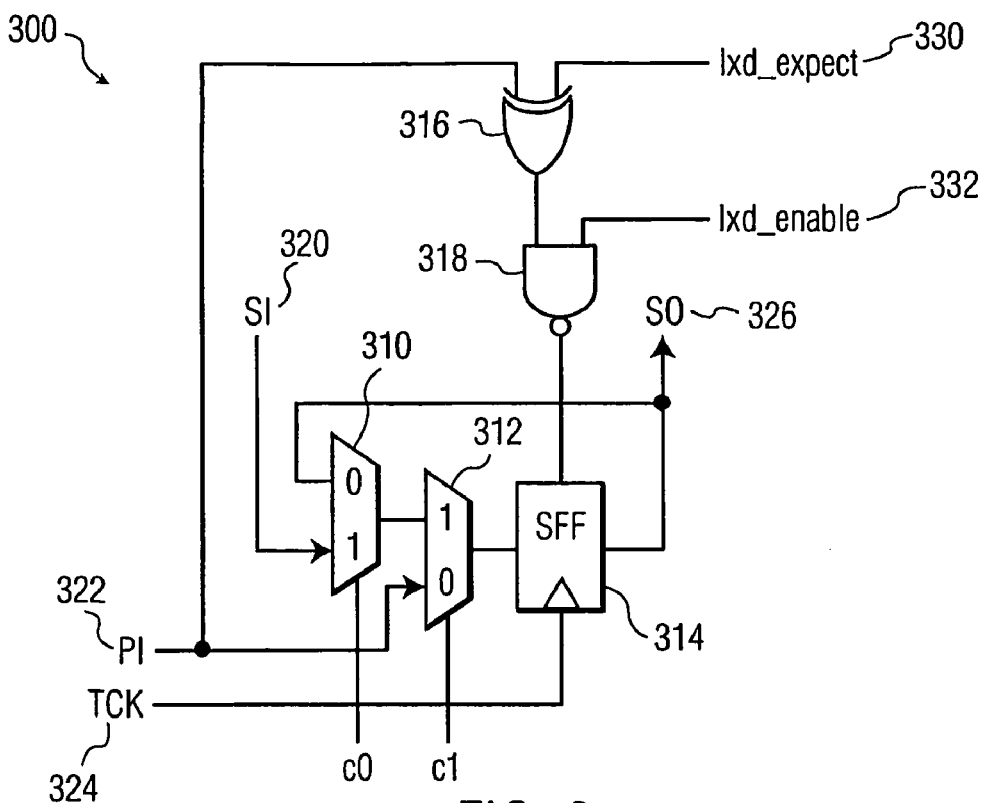
FIG. 3 shows a boundary scan cell implemented for detecting level crossings, according to another example embodiment of the present invention.

FIG. 3 shows a boundary scan cell 300 implemented for detecting level crossings in an integrated circuit (IC) coupled to the boundary scan cell, according to another example embodiment of the present invention. The cell 300 includes input pins for a shift input "SI" 320, a real value input "PI" 322 (representing an actual logic level of the IC being tested) and a clock input "TCK" 324, as well as a shift output "SO" 326. The cell 300 further includes logic circuitry, in this instance represented in the form of two-to-one multiplexers 310 and 312. The inputs of the multiplexer 310 are the shift input "SI" 320 and shift output "SO" 326 respectively coupled to "1" and "0" inputs. The "1" input of the multiplexer 312 is the output of multiplexer 310, with the "0" input being the real value input 322.

The multiplexers 310 and 312 respectively pass one of the "1" and "0" inputs as a function of control inputs "c0" and "c1." For example, referring to multiplexer 310, "SO" 326 is passed to multiplexer 312 when "c0" is "0," and "SI" 320 is passed to multiplexer 312 when "c0" is "1." Similarly, multiplexer 312 passes the output of the multiplexer 310 when "c1" is "1," and passes "PI" 322 when "c1" is "0." This output of the multiplexer 312 is accordingly passed to a capture flip-flop (SFF) 314.

The input "PI" 322 is also coupled to an input of a two-input XOR gate 316, with the other input of the XOR gate being an expected value input "lxd_expect" 330. The output of the XOR gate 316 is coupled to an input of a two-input NAND gate 318, with the other input of the NAND gate being an enable input signal "lxd_enable" 332. The output of the NAND gate 318 is coupled to the (low-active) asynchronous reset of the capture flip-flop 314. The capture flip-flop 314 accordingly outputs a shift output "SO" 326 as a function of the output of the multiplexer 312, the "TCK" signal 324 and the output of the NAND gate 318 (at the flip-flop's asynchronous reset).

In one implementation, a JTAG TAP (test access port) controller is programmed to provide the control inputs "c0" and "c1" as well as the "lxd_expect" and "lxd_enable" signals, which may be retrieved from an instruction register. In some instances, a driving boundary scan (BS) cell implemented with the integrated circuit (IC) on which the cell 300 is implemented typically drives the "lxd_expect" signal. In other instances, a register is used to provide the value for "lxd_expect" and/or other values as needed.

When entering into a test mode for logic level crossings, the "SI" 320 input as well as control inputs "c0" and "c1" are asserted at "1." The "1" at "SI" 320 is passed from the "1" input at multiplexer 310 to the "1" input at multiplexer 312, which in turn preloads the SFF 314 with "1." This preloading is carried out, for example, using an EXTEST or preload instruction, such as during a Shift-DR state/mode of the JTAG TAP controller for the IC for which the cell 300 is implemented. Once a "1" is preloaded at the SFF 314, "c0" is made "0" while "c1" is maintained at "1" to hold the value at the SFF. During this preload period (and until ready to detect logic level crossings), "lxd_enable" can be held low to eliminate unwanted reset of the SFF 314.

When ready to detect logic level crossings, a capture mode is entered (e.g., effected with a Capture-DR state/mode of the JTAG TAP controller). During the capture mode, an enable "lxd_enable" signal is made "1" on the rising edge of the "TCK" 324 signal following an update signal of the driving BS cell when an appropriate instruction is loaded (e.g., when instruction "LXD" is loaded). A second boundary scan cell in the IC with the cell 300 can provide the expected value signal "lxd_expect" 330. If, in the period after the transition of the enable signal (i.e., from "0" to "1"), a value is present on the input IC pin "PI" 322 that is the inverse from the expected value "lxd_expect" 330, the flip-flop 314 will be reset. Specifically, referring to the XOR gate 316, "PI" 322 and "lxd_expect" 330 are compared and, if "PI" is different from "lxd_expect," the XOR gate 316 passes a "1" to the NAND gate 318. In turn, the NAND gate 318 passes a "0" when both the output form the XOR gate 316 and "lxd_enable" 332 are "1."

In some implementations, the actual value of "PI" 322 is checked to verify a logic level crossing indicated as a "0" shifted out of the SFF 314. In these implementations, upon detecting that "SO" 326 is zero, the TAP controller asserts "c1" at "0" to pass the value of "PI" 322 to the SFF 314. This value is shifted out via "SO" 326 and verified.

Using the above approaches, the cell 300 thus detects unwanted level crossings starting half a "TCK" period (period of the "TCK" signal 324) after the actual update of the signal. In addition, the cell 300 permits an observe mode (i.e., a normal mode), wherein "c1" is asserted at "0" and the multiplexer 312 accordingly passes "PI" 322 to the SFF 314. The value in the SFF 314 can then be shifted out via "SO" 326 (and, if desired, held at the SFF by setting "c0" to "0" and "c1" to 1).

In another embodiment, the frequency and/or duty cycle of the "TCK" signal 324 is adjusted to ascertain information relating to the moment at which the unwanted level crossing occurs. The "TCK" 324 is adjusted so that the circuit with which the cell 300 is implemented is clocked sooner or later, such that "SO" 326 is representative of a condition of the circuit at an earlier or later time. A condition of the circuit, relative to a logic level crossing, can thus be detected at different times. This approach can be implemented in a variety of manners. For instance, when a level crossing is detected using a first frequency or duty cycle of "TCK" 324, the circuit can be repeatedly clocked sooner for iterative boundary scan runs until the logic level crossing is not detected. The time where the logic level crossing is not detected is indicative of the logic level crossing not yet having occurred, helping to pinpoint the time (e.g., near the previous iteration indicating a logic level crossing) at which the logic level crossing occurs. This time can be used to correlate the logic level crossing with a particular circuit and/or operational condition of the circuit. This approach may also be implemented with other embodiments discussed herein, such as those discussed below in connection with FIGS. 4 and 5.

In a more particular implementation, once a logic level crossing has been pinpointed as discussed in the previous paragraph, further boundary scan iterations are carried out using relatively smaller adjustments of "TCK" 324. These iterations are used to more closely pinpoint a point in time at which the logic level crossing has occurred, and in turn can be used to more closely pinpoint a circuit and/or operational condition of the circuit that corresponds to the logic level crossing.

Various ones of the figures herein share features that are similar or that may be implemented similarly to those discussed in connection with other ones of the figures and otherwise herein. In this regard, certain detailed discussion of circuits (and their function) in the following figures is omitted for brevity.

Figure 4:
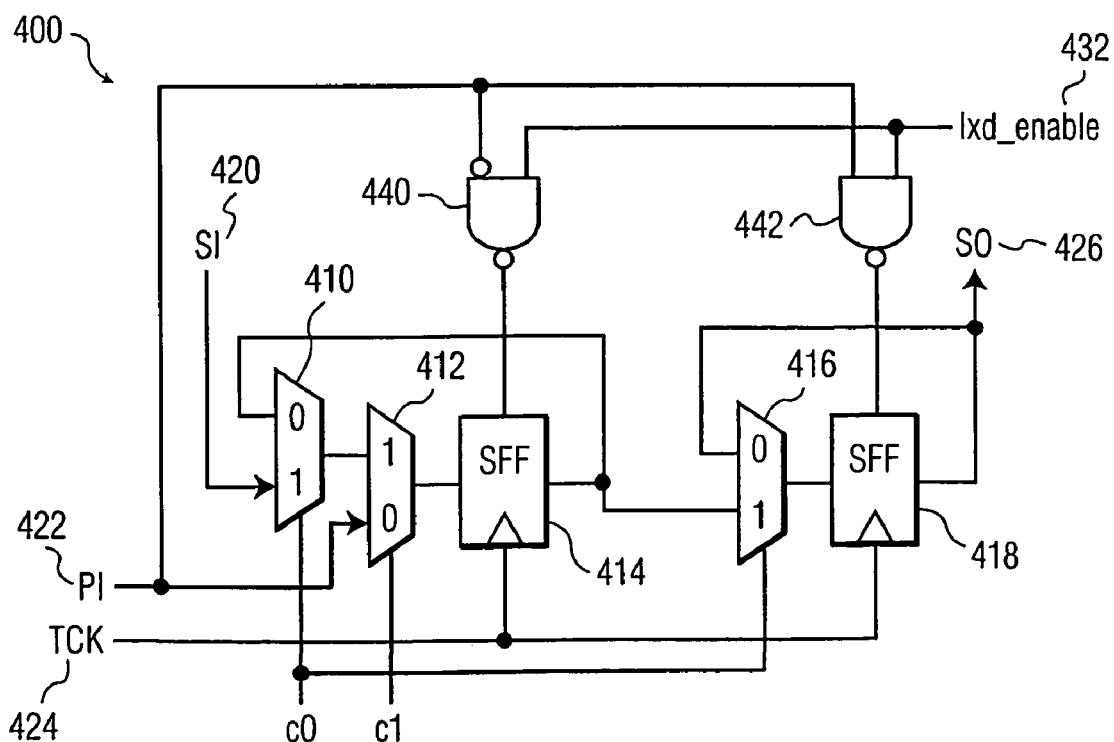
FIG. 4 shows a boundary scan cell implemented for detecting level crossings using two resettable flip-flops, according to another example embodiment of the present invention.

FIG. 4 shows a boundary scan cell 400 implemented for detecting level crossings using two resettable flip-flops SFF 414 and SFF 418, according to another example embodiment of the present invention. Various portions of the boundary scan cell 400 are similar to those shown in and discussed in connection with boundary scan cell 300 in FIG. 3. Here, two multiplexers 410 and 412 are coupled to each other and to input and output signals "SI" 420, "PI" 422, "TCK" 424 and an output of a flip-flop 414 as shown. Controls "c0" and "c1" are respectively implemented with multiplexers 410 and 412.

The output of the multiplexer 412 is coupled to the SFF 414, which has its asynchronous input coupled to a NAND gate 440 and is further driven by "TCK" 424. The NAND gate 440 has as its inputs "PI" 422 (inverted) and the "lxd_enable" signal 432. The output of the SFF 414 is passed to the "0" input of the multiplexer 410, as well as to the "1" input of a two-input multiplexer 416. The "0" input of two-input multiplexer 416 is coupled to signal "SO" 426. The output of the multiplexer 410 is passed to the SFF 418 as a function of control "c0," which is coupled to both multiplexers 410 and 416. The asynchronous reset of the SFF 418 is coupled to an NAND gate 442, having as inputs "lxd_enable" 432 and "PI" 422.

The SFF 414 is reset if a "0" is detected on "PI" 422 after the "0" to "1" transition of enable signal "lxd_enable" 432. Specifically, with "lxd_enable" held high ("1"), and the "0" on "PI" 422 being presented (after inversion) to the NAND gate 440 as a "1," a "0" is presented to the asynchronous reset of the SFF 414. The SFF 418 is reset if a "1" is oh "PI" 422, as a result of the NAND gate 442 being presented "1" from both "lxd_enable" 432 and "PI" and a corresponding "0" presented to the SFF 418. With a fault-free transition at the input pin (either a "0" to "1" or a "1" to a "0" transition) one of SFF 414 or SFF 418 will be re-set and contain a "0." Both flip-flops 414 and 418 are preloaded with "1" and are part of the scan chain. The results from each flip-flop 414 and 418 are shifted out during shift-DR and verified, with a reset condition at both SFF 414 and SFF 418 (SFF 414 and SFF 418 both containing a "0") indicating a logic level crossing.

Effectively, because the values in each of SFF 414 and SFF 418 are sequentially shifted out via "SO" 426, the value of "PI" 422 at different instances may cause a different value to be presented to the respective NAND gates 440 and 442 at different times for a pair of values sequentially shifted out via "SO" 426. For example, if "PI" 422 is "1" when "lxd_enable" 432 transitions from "0" to "1," SFF 414 is not reset and SFF 418 is reset. However, if the value of "PI" 422 changes (crosses logic levels) from "1" to "0" while "lxd_enable" 432 is high, SFF 414 is also reset. Similarly, when "PI" 422 is "0" when "lxd_enable" 432 transitions from "0" to "1," but "PI" crosses to "1" while "lxd_enable" 432 is held high, SFF 414 and SFF 418 are sequentially reset. In either instance involving a logic level crossing of "PI" 422 from "0" to "1" or "1" to "0," the values for SFF 414 and SFF 418 are both shifted out as "0" and a logic level crossing is accordingly detected. With this approach, as well as the approach discussed below with FIG. 5, an expected logic level does not necessarily need to be known to detect a logic level crossing.

Figure 5:
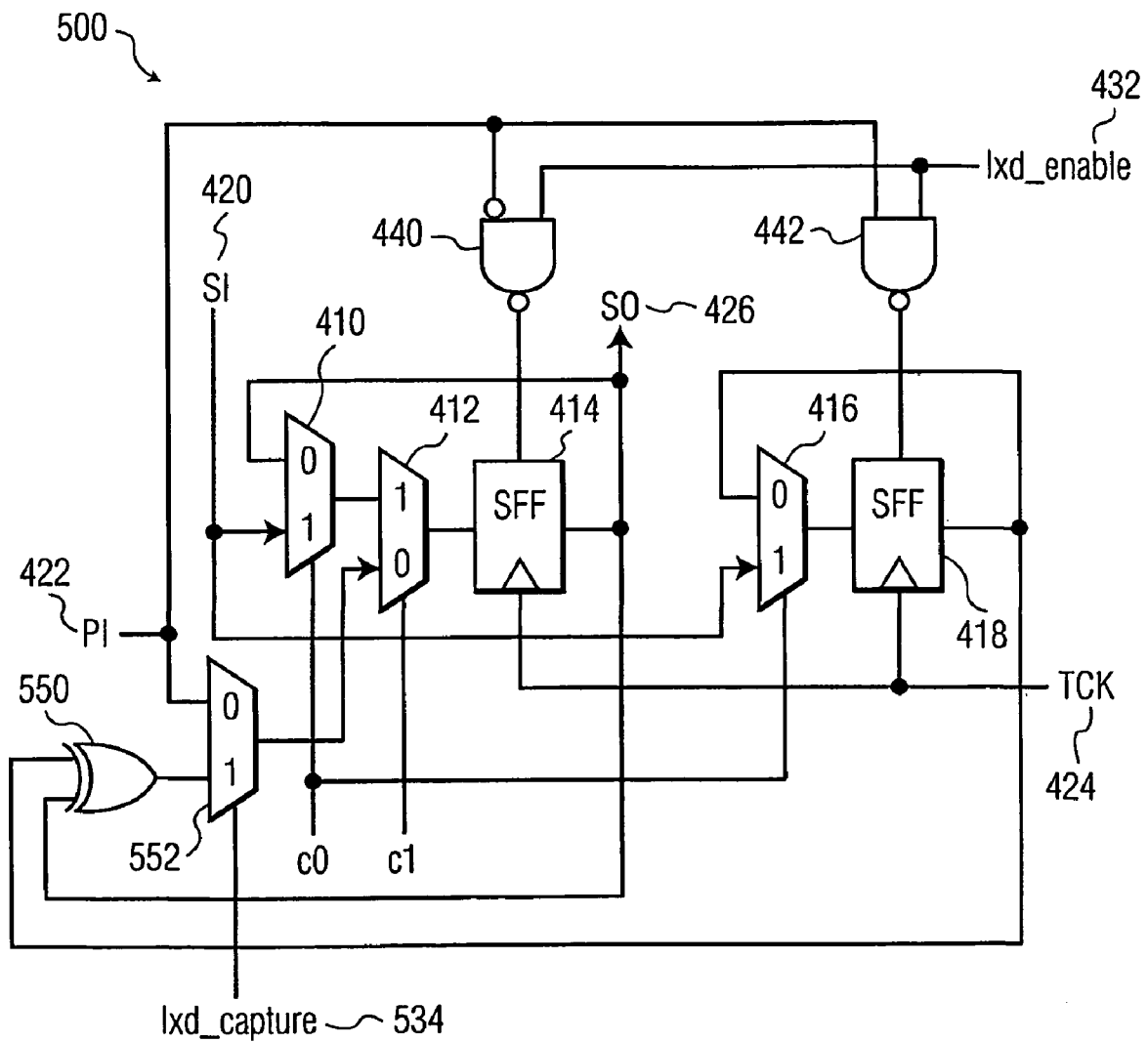
FIG. 5 shows a boundary scan cell implemented for detecting level crossings using an XOR function with outputs from two flip-flops, according to another example embodiment of the present invention.

FIG. 5 shows a boundary scan cell 500 implemented for detecting level crossings using an approach involving an XOR function with outputs from two flip-flops (SFF 414 and SFF 418), according to another example embodiment of the present invention. Various circuits shown in FIG. 5, including circuits numbered 410 through 442, can be implemented in a manner that is generally consistent with the cell 400 shown in FIG. 4.

Additional circuits in FIG. 5, relative to the circuits shown in FIG. 4, include a two-input XOR gate 550 having as it's inputs an output of SFF 418 and "SO" 426. The output of the XOR gate 550 is coupled to the "1" input of a multiplexer 552, which has it's "0" input coupled to "PI" 422 and its output coupled to the "0" input of the multiplexer 412. The control for the multiplexer 552 is an "lxd_capture" signal 534.

Differences for the circuits in FIG. 5 that are common to circuits in FIG. 4, relative to the circuits in FIG. 4, include the following. The "0" input of the multiplexer 412 is coupled to the output of multiplexer 552, rather than "PI" 422. The output of SFF 410 is "SO"426, rather than being the "1" input of the SFF 416 (which is now "SI" 420). The output of SFF 418, is not "SO" and is further coupled to one of the two inputs for the XOR gate 550.

In FIG. 5, the XOR function of the outputs of the two flip-flops 414 and 418 (at XOR gate 550) is used to detect if a logic level crossing was observed during the assertion of "lxd_enable" 432 (at "1"). Specifically, flip-flops SFF 414 and SFF 418 are respectively implemented with NAND gates 440 and 442 in a manner similar to that shown in FIG. 4. After SFF 414 and 418 are preloaded with a "1" and during the assertion of "lxd_enable" 432 at "1," a logic level crossing of "PI" 422 results in both flip-flops being reset.

The value of the XOR gate 550 is captured in the SFF 414, as passed via the multiplexers 552 and 412, during a capture mode (e.g., a Capture-DR mode of a TAP controller) when an appropriate instruction (e.g., "LXD") is active (at "1") and "c1" is held low (at "0"). When this instruction "LXD" is active, the input of the SFF 414 is driven by the XOR output of XOR gate 550 as selected by the multiplexer 552. In this application, the SFF 414 is optionally the only flip-flop that is part of the scan-chain (i.e., as implemented with the IC to which the cell 500 is applied). With this approach, the comparison of the values at SFF 414 and SFF 418, which is done outside of the cell as shown in FIG. 4, is automatically implemented with the XOR gate 550. That is, when the output of the XOR gate 550 is "0," a logic level crossing is indicated.

In some implementations, and referring to the example embodiments shown in FIGS. 3 and 5, the boundary scan cell appears as a normal observe-only BS cell when the "lxd_enable" and "lxd_capture" signals are kept low. This approach is implemented by making the "lxd_enable" and "lxd_capture" signals active only when the "LXD" instruction is selected. Similar approaches are discussed above, with "PI" signals passed and shifted out with according signals asserted on multiplexers feeding the flip-flips that provide shift output signals.

The various embodiments described above and shown in the figures are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. For example, one or more of the above example embodiments and implementations may be implemented with a variety of circuits, boundary scan cell arrangements and other approaches. Other circuit functions, exhibited individually or collectively by the circuits shown in the figures and/or discussed above, may also be implemented using other circuit to carry out similar functionality. For instance, as described with and shown in the figures, the reset approach with the flip-flops and the associated NAND gates controlling the reset, the NAND gates may alternately be implemented with AND gates, with the flip-flip resets implemented accordingly (e.g., high-active). In addition, the function of the resets for the flip-flops may be implemented with a set function, with a "0" preloaded into the flip-flops (instead of a "1"). Such modifications and changes do not depart from the true spirit and scope of the present invention that is set forth in the following claims.

What is claimed is:

1. A boundary scan circuit arrangement for detecting logic level crossing in an integrated circuit, the boundary scan circuit arrangement comprising:
   a logic level crossing detection circuit including a flip-flop having a reset input coupled to a reset signal having a value that varies as a function of an actual logic level of the integrated circuit, the flip-flop being reset from a "1" to a "0" value as a function of the reset signal; and
   the logic level crossing detection circuit being adapted to indicate a logic level crossing condition of the integrated circuit as a function of a reset condition of the flip-flop;
   wherein:
   the logic level crossing detection circuit further includes:
      another flip-flop having a reset input coupled to another reset signal that varies as a function of an actual logic level of the integrated circuit; and
      wherein the reset signals provided to each flip-flop reset input are respectively provided, for a particular logic level to reset one of the flip-flops and not the other; and the logic level crossing detection circuit is adapted to indicate the logic-level crossing condition of the integrated circuit as a function of the reset condition of both flip-flops.

2. The arrangement of claim 1, wherein the logic level crossing circuit is adapted to indicate a logic level crossing condition of the integrated circuit when both of the flip-flops are reset.

3. The arrangement of claim 1, wherein the reset signals provided to each flip flop are susceptible to change in response to a change in the actual logic level of the integrated circuit, and wherein both flip-flops are reset when the actual logic level of the integrated circuit changes.

4. A boundary scan circuit arrangement for detecting logic level crossing in an integrated circuit, the boundary-scan circuit arrangement comprising:
   first and second flip-flops;
   a loading circuit configured and arranged to selectively;
      load the first and second flip-flop circuits with a value;
      hold the value in the first and second flip-flops; and
      pass an actual logic level of the integrated circuit to the flip-flops;
   a first reset circuit configured and arranged to reset the first flip-flop in response to a first actual logic level of the integrated circuit;
   a second reset circuit configured and arranged to reset the second flip-flop in response to a second actual logic level of the integrated circuit that is the inverse of the first actual logic level; and
   an enable circuit coupled to the first and second reset circuits and configured and arranged to provide a signal to enable the first and second reset circuits to pass a reset signal to the flip-flops.

5. The arrangement of claim 4, wherein the first and second reset circuits are respectively adapted to reset the first and second flip-flops in response to the actual logic level switching between the first and second logic levels during a time period when the enable circuit provides an enable signal to the reset circuits.

6. The arrangement of claim 4, further comprising a clocking circuit configured and arranged to provide a clock signal to the flip-flops for shifting out values in the flip-flops.

7. The arrangement of claim 4, further comprising a comparison circuit configured and arranged to compare the values in the flip-flops and to output a signal indicative of the comparison.

8. The arrangement of claim 7, wherein the comparison circuit is configured and arranged to output a signal indicating a logic level crossing in response to the values in both flip-flops being equal after the enable circuit has provided the enable signal.

9. The arrangement of claim 4, wherein the first and second reset circuits and the flip-flops are configured and arranged such that:
   during a period when the enable signal is provided, only one of the flip-flops is reset when die actual logic level of the integrated circuit is constant; and
   during a period when fee enable signal is provided, both of the flip-flops are reset when the actual logic level of the integrated circuit crosses between logic levels.

10. A method for detecting logic level crossing in an integrated circuit, the method comprising:
    providing a reset signal to a flip-flop, the reset signal having a value that varies as a function of an actual logic level of the integrated circuit, the flip-flop being reset from a "1" to a "0" value as a function of the reset signal;
    indicating a logic level crossing condition of the integrated circuit as a function of a reset condition of the flip-flop; and
    providing another reset signal to another flip-flop as a function of an actual logic level of the integrated circuit;
    wherein providing the reset signals to each flip-flop includes providing, for a particular logic level, reset signals that respectively reset one of the flip-flops and not the other; and
    wherein indicating the logic level crossing condition of the integrated circuit as a function of the reset condition includes indicating the logic level crossing condition of the integrated circuit as a function of the reset condition of both flip-flops.

11. The method of claim 10, wherein providing the reset signals to each flip-flop includes providing reset signals to both flip-flops when the actual logic level of the integrated circuit switches between logic levels and wherein indicating the logic level crossing condition of the integrated circuit as a function of the reset condition of both flip-flops includes indicating a logic level crossing when bother flip-flops are reset.

* * * * *